United States Patent
Kawanago et al.

(10) Patent No.: US 11,305,385 B2
(45) Date of Patent: Apr. 19, 2022

(54) FLUX

(71) Applicant: Senju Metal Industry Co., Ltd., Tokyo (JP)

(72) Inventors: Tomohisa Kawanago, Tochigi (JP); Miyuki Hiraoka, Tochigi (JP); Takahiro Nishizaki, Tochigi (JP); Naokatsu Kojima, Tochigi (JP); Hiroyoshi Kawasaki, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 180 days.

(21) Appl. No.: 15/869,202

(22) Filed: Jan. 12, 2018

(65) Prior Publication Data

US 2018/0200845 A1 Jul. 19, 2018

(30) Foreign Application Priority Data

Jan. 13, 2017 (JP) .............................. JP2017-004176

(51) Int. Cl.
| | | |
|---|---|---|
| B23K 35/362 | (2006.01) | |
| B23K 35/36 | (2006.01) | |
| H05K 3/34 | (2006.01) | |
| B23K 101/36 | (2006.01) | |
| B23K 101/42 | (2006.01) | |

(52) U.S. Cl.
CPC ........ *B23K 35/362* (2013.01); *B23K 35/3612* (2013.01); *B23K 35/3618* (2013.01); *H05K 3/3489* (2013.01); *B23K 2101/36* (2018.08); *B23K 2101/42* (2018.08)

(58) Field of Classification Search
CPC .............. B23K 35/362; B23K 35/3612; B23K 35/365; B23K 35/368; H05K 3/3489; H05K 2201/10674; C07C 215/10; C07C 215/28
USPC ..... 148/23, 25, 22; 228/179.1, 178, 256, 33, 228/223, 207, 214, 41; 136/263; 75/10.46
See application file for complete search history.

(56) References Cited

U.S. PATENT DOCUMENTS

| | | | | |
|---|---|---|---|---|
| 5,004,509 A | * | 4/1991 | Bristol ............... | B23K 35/3613 148/22 |
| 6,059,894 A | * | 5/2000 | Pendse ............... | B23K 35/3618 148/23 |
| 6,417,573 B1 | * | 7/2002 | Pendse ............... | B23K 35/3618 257/778 |
| 6,452,475 B1 | | 9/2002 | Kawazu et al. | |
| 2003/0080397 A1 | | 5/2003 | Sakuyama et al. | |
| 2004/0000355 A1 | * | 1/2004 | Suga ................... | B23K 35/262 148/25 |
| 2008/0000549 A1 | * | 1/2008 | Sheng ................. | B23K 35/025 148/23 |
| 2012/0101191 A1 | * | 4/2012 | Enomoto ............. | H01L 23/295 523/466 |
| 2012/0156512 A1 | | 6/2012 | Nakano et al. | |
| 2013/0105558 A1 | * | 5/2013 | Abe ..................... | B23K 1/0016 228/179.1 |
| 2015/0130585 A1 | | 5/2015 | Nakajima et al. | |

FOREIGN PATENT DOCUMENTS

| | | | |
|---|---|---|---|
| CN | 103635285 A | | 3/2014 |
| CN | 105636740 A | | 6/2016 |
| EP | 1306897 A2 | | 5/2003 |
| JP | 2000306477 A | | 11/2000 |
| JP | 2001284787 A | | 10/2001 |
| JP | 2002239785 A | | 8/2002 |
| JP | 2003025089 A | * | 1/2003 |
| JP | 2013239405 A | | 11/2013 |
| JP | 201612407 A | | 1/2016 |
| JP | 2017217694 A | * | 12/2017 |
| WO | 2010055845 A1 | | 5/2010 |

OTHER PUBLICATIONS

Encyclopedia Britannica; Definition of a Surfactant (Chemical Compound); accessed Oct. 10, 2019; https://www.britannica.com/science/surfactant (Year: 2019).*

Chemical Book; "Hexylene Glycol"; https://www.chemicalbook.com/ProductChemicalPropertiesCB5353705_EN.htm; Retrieved from interneton Sep. 21, 2021 (Year: 2021).*

Chemistry LibreTexts; "Acidity of Alcohols"; https://chem.libretexts.org/Courses/Purdue/Purdue_Chem_26100%3A_Organic_Chemistry_I_(Wenthold)/Chapter_10%3A_Alcohols/10.4_Acidity_of_Alcohols/Acidity_of_Alcohols; Retrieved from internet on Sep. 21, 2021 (Year: 2021).*

Liu, Yi-jun, "Special Low Molecular Aliphatic Diols Containing Side Alkyl Group", Chemical Propellants & Polymeric Materials, 2005, pp. 17-20. English-language Abstract.

\* cited by examiner

*Primary Examiner* — Alexandra M Moore
*Assistant Examiner* — Austin Pollock
(74) *Attorney, Agent, or Firm* — The Webb Law Firm

(57) ABSTRACT

Provided is a flux which is rosin-free and contains 50% by mass or more and 90% by mass or less of 2,4-diethyl-1,5-pentanediol, more than 0% by mass and less than 50% by mass of a solvent, 1% by mass or more and 15% by mass or less of an organic acid, wherein the total amount of the 2,4-diethyl-1,5-pentanediol and the solvent is 83% by mass or more and 99% by mass or less. This flux does not require washing with an organic detergent when transferred to solder balls is provided.

2 Claims, No Drawings

FLUX

CROSS REFERENCE TO RELATED APPLICATION

This application claims priority to Japanese Patent Application No. 2017-004176 filed Jan. 13, 2017, the disclosure of which is hereby incorporated in its entirety by reference.

BACKGROUND

1. Technical Field

The present invention relates to a flux.

2. Related Art

In recent years, along with miniaturization of electronic components, the electrode pitches, which are parts to be soldered of each of the electronic components, have been increasingly narrowed. With the narrowing of the electrode pitches, the diameter of each solder ball mounted on the electrodes has been also miniaturized.

A method of making solder bumps has been adapted as before to mount solder balls on electrodes coated with a flux, and then heat them. Along with the recent miniaturization of solder balls, another method to transfer a flux containing rosin to solder balls and to mount the solder balls having the flux on electrodes has been also adapted.

As a flux used in this method, Japanese Patent Application Publication No. 2001-284787 discloses a flux having a viscosity ratio of 2 or more and 5 or less, and a viscosity of 2 Pa·s or more and 100 Pa·s or less.

SUMMARY

However, when any flux containing rosin is transferred to the solder balls and the balls are mounted on the electrodes, the flux residue remaining after reflowing may have to wash off with an organic detergent. The organic detergent used for washing the flux residue may impact the environment. The above-described Japanese Patent Application Publication No. 2001-284787, however, has given no consideration on these issues.

Therefore, by taking the environment into consideration, there may be a method of transferring a rosin-free flux to solder balls, and then mounting the balls on electrodes. However, if such a rosin-free flux is transferred to the solder balls and the balls are mounted on the electrodes, any of the solder balls can come off from the electrode pads (missing ball). Missing the ball enables any bonding defects and/or any conductive defects to be caused.

This invention addresses the above-mentioned issues and has an object to provide a flux which is transferred to the solder balls but may not require washing with organic detergent.

To achieve the above-mentioned object, a flux in this invention is rosin-free and contains 50% by mass or more and 90% by mass or less of 2,4-diethyl-1,5-pentanediol, more than 0% by mass and less than 50% by mass of a solvent, and 1% by mass or more and 15% by mass or less of an organic acid wherein the total amount of 2,4-diethyl-1,5-pentanediol and the solvent is 83% by mass or more and 99% by mass or less.

It is desirable to provide the flux further containing 0% by mass or more and 5% by mass or less of an amine, and 0% by mass or more and 5% by mass or less of a halogen compound.

It is also desirable to provide the flux further containing 0% by mass or more and 5% by mass or less of a thixotropic agent, 0% by mass or more and 5% by mass or less of a base agent, and 0% by mass or more and 15% by mass or less of a surfactant.

It is further desirable to provide the flux wherein the weight of the flux after heating is 15% or less than the weight of the flux before the heating, when packing 10 mg of the flux in an aluminum pan and heating the flux up to 250° C. at a temperature rising rate of 1° C./sec.

The flux of the present invention may not require washing of flux residues with an organic detergent. In addition, the flux of the present invention may mount the solder balls at desired positions.

The concluding portion of this specification particularly points out and directly claims the subject matter of the present invention. However, those skilled in the art will best understand both the organization and method of operation of the invention, together with further advantages and objects thereof, by reading the remaining portions of the specification.

DETAILED DESCRIPTION

The following will describe a flux according to an embodiment of the present invention. The present invention is not limited to the following specific examples.
Examples of Flux Composition The flux of the present embodiment contains 50% by mass or more and 90% by mass or less of 2,4-diethyl-1,5-pentanediol, more than 0% by mass and less than 50% by mass of a solvent, and 1% by mass or more and 15% by mass or less of an organic acid. The total amount of 2,4-diethyl-1,5-pentanediol and the solvent is 83% by mass or more and 99% by mass or less. The flux of the present embodiment may further contain any one or a combination of an amine, a thixotropic agent, a base agent, a surfactant, and a halogen compound.

The 2,4-diethyl-1,5-pentanediol is represented by the following chemical formula:

[Chemical Formula 1]

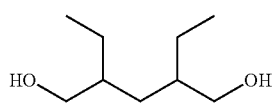

The solvent is selected from generally known glycol ether compounds. The solvent preferably prevents any volatilization thereof within a low temperature range from 120° C. to 150° C., to efficiently achieve the effect of the activator. If the solvent volatilizes, flowability of the flux decreases, and this hinders wet and spread of the flux over joints. Therefore, the boiling point of the solvent is preferably 200° C. or more. The use of a solvent which volatilizes at the reflowing temperature is preferred, and examples of the solvent used herein include hexylene glycol, hexyl diglycol, 1,3-butanediol, octanediol, alkylene oxide-resorcin copolymer, 2-ethyl-1,3-hexanediol, 2-ethylhexyl diglycol, phenyl glycol, or terpineol.

The organic acid is added as an activator component in the flux. Examples of the organic acid used herein include glutaric acid, phenyl succinic acid, succinic acid, methyl methacrylate, malonic acid, adipic acid, azelaic acid, glycolic acid, diglycolic acid, thioglycolic acid, thiodiglycolic acid, propionic acid, malic acid, tartaric acid, dimer acid, hydrogenated dimer acid, or trimer acid.

The flux of the present embodiment may contain an amine as an activator component in the flux. Examples of the amine include imidazole, polyoxyalkylene amine, and aminoalcohol, and specific examples may include 2-methylimidazole, 2-undecylimidazole, 2-ethyl-4-methylimidazole, 1-benzyl-2-phenyl imidazole, polyoxyethylene amine, polyoxypropylene amine, 2-ethyl aminoethanol, diethanolamine, or triethanolamine. It is preferable that the proportion of the additive of the amine is 0% by mass or more and 5% by mass or less with reference to 100% by mass of the flux.

The flux of the present embodiment may contain amide stearate as a thixotropic agent. It is preferable that the proportion of the additive of the thixotropic agent is 0% by mass or more and less than 10% by mass with reference to 100% by mass of the flux. It is more preferable that the proportion of the additive of the thixotropic agent is 0% by mass or more and 5% by mass or less.

The flux of the present embodiment may contain, as a base agent, for example, polyethylene glycol. It is preferable that the proportion of the additive of the base agent is preferably 0% by mass or more and 5% by mass or less with reference to 100% by mass of the flux.

The flux of the present embodiment may contain, as a surfactant, for example, hydroxypropylated ethylenediamine, polyoxypropylene ethylenediamine, ethylenediamine tetrapolyoxyethylene polyoxypropylene, polyoxyethylene alkyl amine, polyoxyethylene alkyl ether, or polyoxyethylene alkyl amide. It is preferable that the proportion of the additive of the surfactant is preferably 0% by mass or more and 15% by mass or less with reference to 100% by mass of the flux.

The flux of the present embodiment may contain an amine halogenated hydroacid salt or an organic halogen compound as a halogen compound. Examples of the amine halogenated hydroacid salt include ethylamine hydrochloride, ethylamine hydrobromide, ethylamine hydriodide, 2-ethylhexylamine hydrochloride, 2-ethylhexylamine hydrobromide, 2-ethylhexylamine hydriodide, cyclohexylamine hydrochloride, cyclohexylamine hydrobromide, and cyclohexylamine hydriodide. Examples of the organic halogen compound include 2,3-dibromo-1,4-butanediol, and trans-2,3-dibromo-2-butene-1,4-diol. It is preferable that the proportion of the additive of the halogen compound is 0% by mass or more and 5% by mass or less with reference to 100% by mass of the flux. It is more preferable that the proportion of the additive thereof is 0% by mass or more and 1% by mass or less.

As other additives to the above-described flux, for example, a coloring agent or the like may be added within the range which will not impair the performance of the flux.

Executed Examples

The following will describe specific executed examples of the flux according to the present invention, but the present invention is not limited to the following specific executed examples. The values without unit in the following tables represent % by mass.

Regarding Table 1

In order to determine the components contained in the fluxes, the fluxes of the Executed Example 1 and the Comparative Examples 1 to 3 were prepared according to the composition shown in Table 1, and subjected to the validation whether or not missing ball and the below-described test (JIS K 0129) by the TG (thermal gravimetry) method.

(I) Validation of Missing Ball (A) Evaluation Method

Solder balls each having a composition of Sn-3Ag-0.5Cu and a diameter of 600 μm were prepared. After transferring the fluxes of the Executed Example 1 and the Comparative Examples 1 to 3 to the solder balls thus prepared, the solder balls to which the fluxes had been transferred were mounted on the electrodes of substrates. These substrates were heated up to 250° C. at a temperature rising rate of 1° C./sec, and then cooled to room temperature. The appearance of the electrodes after cooling was confirmed by visual observation.

(B) Evaluation Criterion

◯: Solder remained without coming off the electrode.

x: Solder came off from the electrode (missing ball).

Missing the ball enables any bonding defects and/or any conductive defects to be caused. If the solder remains on the electrode after heating, bonding defects and conductive defects can be prevented.

(II) Regarding Test by TG Method (A) Evaluation Method 10 mg of the fluxes prepared at the proportion shown in the Executed Example and the Comparative Examples in Table 1 were packed in aluminum pans, and heated up to 250° C. at a temperature rising rate of 1° C./sec using TGD9600 manufactured by ULVAC. The weights of the fluxes after heating were measured to confirm whether or not the weights were 15% or less of those before heating.

(B) Evaluation Criterion

◯: Weight was 15% or less of that before heating.

x: Weight was more than 15% of that before heating.

When the weight of the flux is 15% or less of that before heating, it is evaluated that the flux does not require washing after reflowing because the components in the flux have been sufficiently volatilized by heating. When the weight of the flux is more than 15% of that before heating, it is evaluated that volatilization of the components in the flux is insufficient. When volatilization of the components in the flux is insufficient and much residue remains, bonding defects and conductive defects can occur. On the other hand, when the components in the flux thoroughly vaporize, the solder bumps do not cause any bonding defects or conductive defects. In addition, sufficient volatilization of the components in the flux can prevent the formation of underfill voids in the resin sealing (underfill) process after mounting. The underfill voids likely occur when the residue evaporates during curing of the underfill.

TABLE 1

| | Component | Executed Example 1 | Comparative Example 1 | Comparative Example 2 | Comparative Example 3 |
|---|---|---|---|---|---|
| | 2,4-diethyl-1,5-pentanediol | 70 | | | |
| | Isobornyl cyclohexanol | | | 72 | |
| Solvent | Hexylene glycol | 22 | 92 | 12 | 52 |
| Organic acid | Glutaric acid | 8 | 8 | 8 | 8 |

TABLE 1-continued

| | Component | Executed Example 1 | Comparative Example 1 | Comparative Example 2 | Comparative Example 3 |
|---|---|---|---|---|---|
| Activator aid | 2-ethyl-4-methylimidazole | | | 8 | |
| Rosin | Polymerized rosin | | | | 40 |
| | Missing Ball | ○ | x | ○ | ○ |
| | TG test | ○ | ○ | x | x |
| | General evaluation | ○ | x | x | x |

The flux of the Executed Example 1 contained 70% by mass of 2,4-diethyl-1,5-pentanediol, 22% by mass of hexylene glycol as the solvent, and 8% by mass of glutaric acid as the organic acid. The flux of Executed Example 1 did not cause to miss any ball, and achieved a good result in the test by the TG method. This indicates that the flux of the Executed Example 1 prevents missing the ball, and sufficiently volatilizes the components in the flux after reflowing.

The flux of the Comparative Example 1 contained 92% by mass of hexylene glycol as the solvent, and 8% by mass of glutaric acid as the organic acid. The flux of the Comparative Example 1 achieved a good result in the test by the TG method, but caused to miss the ball.

The flux of the Comparative Example 2 contained 12% by mass of hexylene glycol, 72% by mass of isobornyl cyclohexanol, 8% by mass of glutaric acid, and 8% by mass of 2-ethyl-4-methylimidazole as the activator aid. The flux of the Comparative Example 2 prevented missing the ball, but did not achieve a good result in the test by the TG method. Such a fact that the flux of Comparative Example 2 did not achieve the good result in the test by the TG method cannot be evaluated as a flux which does not require washing after reflowing.

The flux of the Comparative Example 3 contained 52% by mass of hexylene glycol, 8% by mass of glutaric acid, and 40% by mass of polymerized rosin as rosin. The flux of the Comparative Example 3 prevented missing the ball, but did not achieve a good result in the test by the TG method. Such a fact that the flux of the Comparative Example 3 did not achieve the good result in the test by the TG method cannot be evaluated as a flux which does not require washing after reflowing.

The reason why missing the ball did not occur in the Executed Example 1 but missing the ball occurred in the Comparative Example 1 is that the flux of the Executed Example 1 contained 2,4-diethyl-1,5-pentanediol but the flux of the Comparative Example 1 did not contain 2,4-diethyl-1,5-pentanediol.

The results of the Executed Example 1 and the Comparative Examples 1 to 3 indicate that the flux is necessary for including 2,4-diethyl-1,5-pentanediol to obtain good results in the validation of missing ball and the test by the TG method, and the flux containing 2,4-diethyl-1,5-pentanediol, hexylene glycol, and glutaric acid does not require washing of the flux residue by an organic detergent, and allows mounting of solder balls on their desired locations.

Although not included in Table 1, in addition to the Executed Example 1, a flux which is rosin-free and contains 50% by mass or more and 90% by mass or less of 2,4-diethyl-1,5-pentanediol, more than 0% by mass and less than 50% by mass of a solvent, 1% by mass or more and 15% by mass or less of an organic acid did not cause to miss the ball and achieved a good result in the test by the TG method as is the case with the Executed Example 1.

Regarding Table 2

Subsequently, in order to determine the amounts of the components of the flux containing 2,4-diethyl-1,5-pentanediol, the fluxes of Executed Examples and Comparative Examples were prepared according to the composition in Table 2, and the solder wet and spread test and the test by the TG method were carried out as follows. The test by the TG method used the same evaluation method and criterion as those validated in Table 1.

(I) Regarding Solder Wet and Spread Test (A) Evaluation Method

Cu plates having a thickness of 0.3 mm and a dimension of 30 mm×30 mm, fluxes of the Executed Examples and the Comparative Examples prepared according to the percentage in Table 2, and solder balls each having a composition Sn-3Ag-0.5Cu and a diameter of 600 μm were prepared. The prepared fluxes were respectively transferred to the solder balls, and the solder balls having the fluxes attached were mounted on Cu plates. The Cu plates were heated up to 250° C. at a temperature rising rate of 1° C./sec, and then cooled to room temperature. After cooling the Cu plates, the wet spreading diameter of the solder was measured.

(B) Evaluation Criteria

○: Wet spreading diameter was 1000 μm or more.

x: Wet spreading diameter was less than 1000 μm.

The use of a flux having poor wettability in a solder likely causes soldering defects such as a bonding defect, but the use of a flux having good wettability reduces soldering defects.

TABLE 2

| | Component | Executed Example 1 | Executed Example 2 | Executed Example 3 | Executed Example 4 | Executed Example 5 | Executed Example 6 | Executed Example 7 | Executed Example 8 | Executed Example 9 |
|---|---|---|---|---|---|---|---|---|---|---|
| | 2,4-diethyl-1,5-pentanediol | 70 | 90 | 50 | 50 | 89 | 70 | 70 | 70 | 70 |
| Solvent | Hexylene glycol | 22 | 9 | 35 | | | 20 | 20 | 21 | 21 |
| | Hexyl diglycol | | | | 49 | | | | | |
| | 1,3-butanediol | | | | | 1 | | | | |
| Organic acid | Glutaric acid | 8 | 1 | 15 | 1 | 10 | | | 8 | 8 |
| Amine | Phenyl succinate | | | | | | 10 | | | |
| | Methyl methacrylate | | | | | | | 10 | | |
| | 2-undecylimidazole | | | | | | | | 1 | |
| | 2-ethylamino ethanol | | | | | | | | | 1 |

TABLE 2-continued

| | Component | Executed Example 10 | Executed Example 11 | Executed Example 12 | Executed Example 13 | Executed Example 14 | Comparative Example 4 | Comparative Example 5 |
|---|---|---|---|---|---|---|---|---|
| Thixotropic agent | Stearic acid amide | | | | | | | |
| Halogen compound | Ethylamine hydrobromide 2,3-dibromo-1,4-budanediol | | | | | | | |
| | Wet and spread | ○ | ○ | ○ | ○ | ○ | ○ | ○ |
| | TG test | ○ | ○ | ○ | ○ | ○ | ○ | ○ |
| | General evaluation | ○ | ○ | ○ | ○ | ○ | ○ | ○ |
| | 2,4-diethyl-1,5-pentanediol | 70 | 70 | 70 | 70 | 65 | 40 | 60 |
| Solvent | Hexylene glycol | 17 | 15 | 21 | 21 | 22 | 50 | 20 |
| | Hexyl diglycol | | | | | | | |
| | 1,3-butanediol | | | | | | | |
| Organic acid | Glutaric acid | 8 | 10 | 8 | 8 | 8 | 10 | 10 |
| Amine | Phenyl succinate | | | | | | | |
| | Methyl methacrylate | | | | | | | |
| | 2-undecylimidazole | 5 | | | | | | |
| | 2-ethylamino ethanol | | | | | | | |
| Thixotropic agent | Stearic acid amide | | 5 | | | | | 10 |
| Halogen compound | Ethylamine hydrobromide | | | 1 | | | | |
| | 2,3-dibromo-1,4-budanediol | | | | 1 | 5 | | |
| | Wet and spread | ○ | ○ | ○ | ○ | ○ | X | ○ |
| | TG test | ○ | ○ | ○ | ○ | ○ | ○ | X |
| | General evaluation | ○ | ○ | ○ | ○ | ○ | X | X |

As indicated in Table 2, the fluxes of the Executed Examples 1 to 3 contained 50% by mass or more and 90% by mass or less of 2,4-diethyl-1,5-pentanediol, more than 0% by mass and less than 50% by mass of hexylene glycol as the solvent, and 1% by mass or more and 15% by mass or less of glutaric acid as the organic acid. The fluxes of the Executed Examples 1 to 3 achieved good results in the solder wet and spread test and the test by the TG method.

The flux of Comparative Example 4 has a smaller content proportion of 2,4-diethyl-1,5-pentanediol and a higher content proportion of hexylene glycol than the fluxes of the Executed Examples 1 to 3. The flux of the Comparative Example 4 contained 40% by mass of 2,4-diethyl-1,5-pentanediol. The flux of the Comparative Example 4 contained 50% by mass of hexylene glycol as the solvent. The flux of the Comparative Example 4 achieved a good result in the test by the TG method, but its wet and spread were insufficient.

The results of the Executed Examples 1 to 3 and the Comparative Example 4 indicate that the content proportion of 2,4-diethyl-1,5-pentanediol is preferably 50% by mass or more and 90% by mass or less; the content proportion of hexylene glycol is preferably more than 0% by mass and less than 50% by mass; and the content proportion of glutaric acid is preferably 1% by mass or more and 15% by mass or less.

More specifically, the flux containing 50% by mass or more and 90% by mass or less of 2,4-diethyl-1,5-pentanediol, more than 0% by mass and less than 50% by mass of hexylene glycol, and 1% by mass or more and 15% by mass or less of glutaric acid achieves good results in the solder wet and spread test and the test by the TG method.

The fluxes of the Executed Examples 4 and 5 were different from the flux of the Executed Example 1 in the type of the solvent. The flux of Example 4 contained 49% by mass of hexyl diglycol as the solvent, and that of the Executed Example 5 contained 1% by mass of 1,3-butanediol as the solvent.

The fluxes of the Executed Examples 4 and 5 also achieved good results in the solder wet and spread test and the test by the TG method, indicating that the type of the solvent does not have an influence on the results of the solder wet and spread test and the test by the TG method, and that the use of any solvent is preferred. The fluxes containing, for example, octanediol, an alkylene oxide-resorcin copolymer, 2-ethyl-1,3-hexanediol, 2-ethylhexyl diglycol, phenyl glycol, or terpineol as the solvent also achieved good results in the solder wet and spread test and the test by the TG method.

In addition, the fluxes of the Executed Examples 4 and 5 contained solvents within the range of more than 0% by mass and less than 50% by mass, which indicates that the content proportion of the solvent is preferably more than 0% by mass and less than 50% by mass.

The results of the Executed Example 1 to 5 and the Comparative Example 4 indicate that the flux containing 50% by mass or more and 90% by mass or less of 2,4-diethyl-1,5-pentanediol, more than 0% by mass and less than 50% by mass of a solvent, and 1% by mass or more and 15% by mass or less of glutaric acid achieves good results in the solder wet and spread test and the test by the TG method.

The fluxes of the Executed Examples 6 and 7 contained 2,4-diethyl-1,5-pentanediol at the same proportion as that of the flux of the Executed Example 1, but contained different types of the organic acids. The flux of the Executed Example 6 contained phenyl succinate as the organic acid, and the flux of the Executed Example 7 contained methyl methacrylate as the organic acid.

The fluxes of the Executed Examples 6 and 7 also achieved good results in the solder wet and spread test and the test by the TG method, indicating that the type of the organic acid does not have an impact on the results of the solder wet and spread test and the test by the TG method, and that the use of any organic acid is preferred. The flux containing, for example, succinic acid, adipic acid, azelaic acid, diglycolic acid, propionic acid, malic acid, tartaric acid, malonic acid, dimer acid, hydrogenated dimer acid, and trimer acid as the organic acid also achieved good results in the solder wet and spread test and the test by the TG method. In addition, the content proportion of the organic acid is preferably 1% by mass or more and 15% by mass or less.

The results of the Executed Examples 1 to 7 and the Comparative Example 4 indicate that the flux containing 50% by mass or more and 90% by mass or less of 2,4-diethyl-1,5-pentanediol, more than 0% by mass and less than 50% by mass of a solvent, and 1% by mass or more and 15% by mass or less of an organic acid achieves good results in the solder wet and spread test and the test by the TG method.

The fluxes of the Executed Examples 8 to 10 contained an amine in addition to 2,4-diethyl-1,5-pentanediol, a solvent, and an organic acid. The flux of the Executed Example 8 contained 1% by mass of 2-undecylimidazole as the amine. The flux of the Executed Example 9 contained 1% by mass of 2-ethyl aminoethanol as the amine. The flux of the Executed Example 10 contained 5% by mass of 2-undecylimidazole. The fluxes of the Executed Examples 8 to 10 achieved good results in the solder wet and spread test and the test by the TG method.

The fluxes of the Executed Examples 8 and 9 contained different types of amines, and both of them achieved good results in the solder wet and spread test and the test by the TG method. This indicates that the type of the amine does not have an impact on the results of the solder wet and spread test and the test by the TG method, and that the use of any amine is preferred. The fluxes containing, for example, 2-methylimidazole, 2-ethyl-4-methylimidazole, 1-benzyl-2-phenyl imidazole, diethanolamine, polyoxyethylene amine, polyoxypropylene amine, or triethanolamine as the amine achieved good results in the solder wet and spread test and the test by the TG method.

The results of the Executed Examples 8 to 10 indicate that the flux containing 50% by mass or more and 90% by mass or less of 2,4-diethyl-1,5-pentanediol, more than 0% by mass and less than 50% by mass of a solvent, 1% by mass or more and 15% by mass or less of an organic acid, and 0% by mass or more and 5% by mass or less of an amine achieves good results in the solder wet and spread test and the test by the TG method.

The flux of the Executed Example 11 contained 5% by mass of amide stearate as a thixotropic agent, in addition to 2,4-diethyl-1,5-pentanediol, a solvent, and an organic acid. The result of the Executed Example 11 indicates that the flux containing 50% by mass or more and 90% by mass or less of 2,4-diethyl-1,5-pentanediol, more than 0% by mass and less than 50% by mass of a solvent, and 1% by mass or more and 15% by mass or less of an organic acid achieves good results in the solder wet and spread test and the test by the TG method regardless of the addition of a thixotropic agent.

The flux of Comparative Example 5 contained 10% by mass of amide stearate, in addition to 2,4-diethyl-1,5-pentanediol, a solvent, and an organic acid, wherein the total amount of 2,4-diethyl-1,5-pentanediol and the solvent was 80% by mass. The flux of the Comparative Example 5 achieved a good result in the solder wet and spread test, but did not achieve a good result in the test by the TG method.

The results of the Executed Example 11 and the Comparative Example 5 indicate that the flux containing 50% by mass or more and 90% by mass or less of 2,4-diethyl-1,5-pentanediol, 1% by mass or more and 15% by mass or less of an organic acid, and more than 0% by mass and less than 50% by mass of a solvent achieves good results in the solder wet and spread test and the test by the TG method in spite of the addition of the thixotropic agent. The proportion of the thixotropic agent contained in the flux is preferably 0% by mass or more and less than 10% by mass, and more preferably 0% by mass or more and 5% by mass or less. Furthermore, in the fluxes of the Executed Examples 1 to 11, the total amount of 2,4-diethyl-1,5-pentanediol and the solvent was 83% by mass or more and 99% by mass or less, and in the flux of the Comparative Example 5, the total amount of 2,4-diethyl-1,5-pentanediol and the solvent was 80% by mass, which indicates that the total amount of 2,4-diethyl-1,5-pentanediol and the solvent is preferably 83% by mass or more and 99% by mass or less.

The flux of the Executed Example 12 contained 1% by mass of ethylamine hydrobromide as a halogen compound, in addition to 2,4-diethyl-1,5-pentanediol, a solvent, and an organic acid. The flux of the Executed Example 13 contained 1% by mass of 2,3-dibromo-1,4-butanediol as the halogen compound, in addition to 2,4-diethyl-1,5-pentanediol, a solvent, and an organic acid. The flux of the Executed Example 14 contained 5% by mass of 2,3-dibromo-1,4-butanediol as the halogen compound, in addition to 2,4-diethyl-1,5-pentanediol, a solvent, and an organic acid. Any of the fluxes of the Executed Examples 12 to 14 achieved good results in the solder wet and spread test and the test by the TG method.

The fluxes of the Executed Examples 12 and 13 contained different types of the halogen compounds, and achieved good results in the solder wet and spread test and the test by the TG method. This indicates that the type of the halogen compound does not have an impact on the results of the solder wet and spread test and the test by the TG method, and the use of any halogen compound is preferred. The flux containing amine halogenated hydroacid salt or organic halogen compound as the halogen compound also achieved good results in the solder wet and spread test and the test by the TG method. More specifically, the fluxes containing, for example, ethylamine hydrochloride, ethylamine hydriodide, 2-ethylhexyl amine hydrochloride, 2-ethylhexyl amine hydrobromide, 2-ethylhexyl amine hydriodide, cyclohexyl amine hydrochloride, cyclohexyl amine hydrobromide, or cyclohexyl amine hydriodide as the amine halogenated hydroacid salt, and trans-2,3-dibromo-2-butene 1,4-diol as the organic halogen compound also achieved good results in the solder wet and spread test and the test by the TG method.

The results of the Executed Examples 12 to 14 indicate that the proportion of the halogen compound contained in the flux is preferably 0% by mass or more and 5% by mass or less, and more preferably 0% by mass or more and 1% by mass or less.

In the Executed Examples 1 to 14 and the Comparative Examples 4 and 5, it did not take place to miss the ball after heating, and solder bumps were formed on the electrodes. Regarding Table 3

Subsequently, in order to determine amounts of the components of the flux, the fluxes of Executed Examples and Comparative Examples were prepared according to the composition indicated in Table 3, and subjected to the solder wet and spread test, the test by the TG method, and the below-described water washability test as follows. The test by the TG method used the same evaluation method and same evaluation criteria validated in Table 1, and the solder wet and spread test used the same evaluation method and same evaluation criteria validated in Table 2.

(I) Regarding Water Washability Test
(A) Evaluation Method

Cu plates having a thickness of 0.3 mm and a dimension of 30 mm×30 mm, fluxes of Executed Examples and Comparative Examples prepared according to the proportion in Table 3, and solder balls having a composition Sn-3Ag-0.5Cu and a diameter of 600 µm were prepared. The prepared fluxes were respectively transferred to the solder balls, and then, the solder balls having the fluxes attached were mounted on each Cu plate. The Cu plates were respectively heated up to 250° C. at a temperature rising rate of 1° C./sec. The Cu plates were washed with water after they cooled to room temperature, and their outer appearance was checked for the flux residue around the soldered points using an enlargement microscope.

(B) Evaluation Criterion

○: Cu plate has no flux residue.

x: Cu plate has a flux residue.

All of the above-described Executed Examples 1 to 14 were low-residue fluxes which did not require washing after reflowing, so that they are regarded as the fluxes which do not require washing with an organic detergent. Even if a flux is formed so that the residue remains on a substrate, it is possible to prevent any bonding defects and conductive defects when the flux residue can be removed by water washing. More specifically, it can be determined that the flux which exhibited good washability in the water washing test allows appropriate removal of the flux residue by water washing without using an organic detergent.

the Comparative Example 6 achieved good results in the water washability test and the test by the TG method, but did not achieve a good result in the wet and spread test.

The results of the Executed Examples 15 to 24 and the Comparative Example 6 indicate that the flux containing 50% by mass or more and 90% by mass or less of 2,4-diethyl-1,5-pentanediol, more than 0% by mass and less than 50% by mass of a solvent, and 1% by mass or more and 15% by mass or less of an organic acid, wherein the total amount of 2,4-diethyl-1,5-pentanediol and the solvent is 83% by mass or more and 99% by mass or less, achieves good results in the solder wet and spread test, the test by the TG method, and the water washability test.

The flux of the Executed Example 16 contained polyoxyalkylene amine as an amine, in addition to 2,4-diethyl-1,5-pentanediol, hexylene glycol as a solvent, tartaric acid as an organic acid. The result of the Executed Example 16 indicates that the flux containing 50% by mass or more and 90%

TABLE 3

| | Component | Executed Example 15 | Executed Example 16 | Executed Example 17 | Executed Example 18 | Executed Example 19 | Executed Example 20 |
|---|---|---|---|---|---|---|---|
| Solvent | 2,4-diethyl-1,5-pentanediol | 60 | 90 | 70 | 55 | 60 | 60 |
| | Hexylene glycol | 30 | 8 | 19 | 30 | 24 | 24 |
| Organic acid | Glutaric acid | | | | | | 5 |
| | Tartaric acid | 10 | 1 | 5 | 5 | 5 | |
| Amine | Polyoxyalkylene amine | | 1 | 1 | | 1 | 1 |
| Base agent | Polyethylene glycol | | | 5 | | 5 | 5 |
| Surfactant | Polyoxypropylene ethylene diamine | | | | 10 | 5 | |
| | Polyoxyethylene cetyl ether | | | | | | 5 |
| Halogen compound | Ethylamine hydrobromide | | | | | | |
| | 2,3-dibromo-1,4-budanediol | | | | | | |
| Rosin | Rosin | | | | | | |
| | Wet and spread | ○ | ○ | ○ | ○ | ○ | ○ |
| | TG test | ○ | ○ | ○ | ○ | ○ | ○ |
| | Water washability test | ○ | ○ | ○ | ○ | ○ | ○ |
| | General evaluation | ○ | ○ | ○ | ○ | ○ | ○ |

| | Component | Executed Example 21 | Executed Example 22 | Executed Example 23 | Executed Example 24 | Comparative Example 6 | Comparative Example 7 |
|---|---|---|---|---|---|---|---|
| Solvent | 2,4-diethyl-1,5-pentanediol | 60 | 60 | 55 | 60 | 40 | 60 |
| | Hexylene glycol | 28 | 23 | 30 | 24 | 50 | 24 |
| Organic acid | Glutaric acid | | | | | | 5 |
| | Tartaric acid | 5 | 5 | 10 | 5 | 5 | |
| Amine | Polyoxyalkylene amine | | 1 | | | | 1 |
| Base agent | Polyethylene glycol | 1 | 5 | | 5 | | 5 |
| Surfactant | Polyoxypropylene ethylene diamine | 5 | 5 | | 5 | 5 | |
| | Polyoxyethylene cetyl ether | | | | | | |
| Halogen compound | Ethylamine hydrobromide | 1 | 1 | 5 | | | |
| | 2,3-dibromo-1,4-budanediol | | | | 1 | | |
| Rosin | Rosin | | | | | | 5 |
| | Wet and spread | ○ | ○ | ○ | ○ | X | ○ |
| | TG test | ○ | ○ | ○ | ○ | ○ | ○ |
| | Water washability test | ○ | ○ | ○ | ○ | ○ | X |
| | General evaluation | ○ | ○ | ○ | ○ | X | X |

As shown in Table 3, in all of the fluxes of the Executed Examples 15 to 24, the content proportion of 2,4-diethyl-1,5-pentanediol was 50% by mass or more and 90% by mass or less, the content proportion of the solvent was more than 0% by mass and less than 50% by mass, and the content proportion of the organic acid was 1% by mass or more and 15% by mass or less, and the total amount of 2,4-diethyl-1,5-pentanediol and the solvent was 83% by mass or more and 99% by mass or less. All of the fluxes of the Executed Examples 15 to 24 achieved good results in the solder wet and spread test, the test by the TG method, and the water washability test.

On the other hand, the flux of Comparative Example 6 contained 40% by mass of 2,4-diethyl-1,5-pentanediol, and 50% by mass of hexylene glycol as the solvent. The flux of by mass or less of 2,4-diethyl-1,5-pentanediol, more than 0% by mass and less than 50% by mass of a solvent, and 1% by mass or more and 15% by mass or less of an organic acid achieves good results in the solder wet and spread test, the test by the TG method, and the water washability test, regardless of the addition of an amine. The proportion of the amine added to the flux is preferably 0% by mass or more and 5% by mass or less, and more preferably 0% by mass or more and 1% by mass or less.

The flux of the Executed Example 17 contained 5% by mass of polyethylene glycol as a base agent, in addition to 2,4-diethyl-1,5-pentanediol, hexylene glycol, tartaric acid, and polyoxyalkylene amine. The result of the Executed Example 16 indicates that the flux containing 50% by mass or more and 90% by mass or less of 2,4-diethyl-1,5-pentanediol, more than 0% by mass and less than 50% by mass of the solvent, and 1% by mass or more and 15% by mass or less of the organic acid achieves good results in the solder wet and spread test, the test by the TG method and the water washability test, regardless of the addition of a base agent. The proportion of the base agent added to the flux is preferably 0% by mass or more and 5% by mass or less.

The flux of the Executed Example 18 contained 10% by mass of polyoxypropylene ethylenediamine as a surfactant, in addition to 2,4-diethyl-1,5-pentanediol, hexylene glycol, and tartaric acid. The flux of the Executed Example 19 contained 5% by mass of polyoxypropylene ethylenediamine, in addition to 2,4-diethyl-1,5-pentanediol, hexylene glycol, tartaric acid, polyoxyalkylene amine, and polyethylene glycol.

The flux of the Executed Example 20 contained 5% by mass of polyoxyethylene cetyl ether as a surfactant, in addition to 2,4-diethyl-1,5-pentanediol, hexylene glycol, glutaric acid as the organic acid, polyoxyalkylene amine, and polyethylene glycol.

The results of the Executed Examples 18 and 19 indicate that the flux containing 50% by mass or more and 90% by mass or less of 2,4-diethyl-1,5-pentanediol, more than 0% by mass and less than 50% by mass of a solvent, and 1% by mass or more and 15% by mass or less of an organic acid achieves good results in the solder wet and spread, the test by the TG method and the water washability test, regardless of the addition of a surfactant.

Although not included in tables, the flux prepared in the same manner as that of the Executed Example 18, except that the content proportion of polyoxypropylene ethylenediamine was changed to 15% by mass, also achieved good results in the solder wet and spread, the test by the TG method, and the water washability test. These results and the results of the Executed Examples 18 to 20 indicate that the type of the surfactant does not have an impact on the results of the solder wet and spread, the test by the TG method, and the water solubility test, and that the use of any surfactant is preferred. The proportion of the surfactant added to the flux is preferably 0% by mass or more and 15% by mass or less, and more preferably 0% by mass or more and 10% by mass or less.

The flux of the Executed Example 21 contained 1% by mass of ethylamine hydrobromide as a halogen compound, in addition to 2,4-diethyl-1,5-pentanediol, hexylene glycol, tartaric acid, polyoxyalkylene amine, and polyethylene glycol. The flux of the Executed Example 22 contained 1% by mass of ethylamine hydrobromide, in addition to 2,4-diethyl-1,5-pentanediol, hexylene glycol, tartaric acid, polyoxyalkylene amine, polyethylene glycol, and polyoxypropylene ethylenediamine. The flux of the Executed Example 23 contained 5% by mass of ethylamine hydrobromide, in addition to 2,4-diethyl-1,5-pentanediol, hexylene glycol, and tartaric acid. The flux of the Executed Example 24 contained 1% by mass of 2,3-dibromo-1,4-butanediol as a halogen compound, in addition to 2,4-diethyl-1,5-pentanediol, hexylene glycol, tartaric acid, polyoxyalkylene amine, polyethylene glycol, and polyoxypropylene ethylenediamine.

The results of the Executed Examples 21 to 23 indicate that the flux containing 50% by mass or more and 90% by mass or less of 2,4-diethyl-1,5-pentanediol, more than 0% by mass and less than 50% by mass of a solvent, and 1% by mass or more and 15% by mass or less of an organic acid achieves good results in the solder wet and spread test, the test by the TG method, and the water washability test, regardless of the addition of a halogen compound. The proportion of the halogen compound added to the flux is preferably 0% by mass or more and 5% by mass or less, and more preferably 0% by mass or more and 1% by mass or less. Furthermore, the results of the Executed Examples 21 to 24 indicate that the type of the halogen compound does not have an impact on the results of the solder wet and spread test, the test by the TG method, and the water washability test, and the use of any halogen compound is preferred.

The flux of the Comparative Example 7 was prepared in the same manner as the flux of the Executed Example 20, except that the surfactant was replaced with the same ratio of rosin. The flux of the Executed Example 20 achieved good results in the solder wet and spread test, the test by the TG method, and the water washability test, but the flux of the Comparative Example 7 did not achieve a good result in the water washability test. These results indicate that the flux containing rosin does not achieve a good result in the water washability test.

The results of the Executed Examples 16 to 24 indicate that the flux containing 50% by mass or more and 90% by mass or less of 2,4-diethyl-1,5-pentanediol, more than 0% by mass and less than 50% by mass of a solvent, and 1% by mass or more and 15% by mass or less of an organic acid achieves good results in the solder wet and spread test, the test by the TG method, and the water washability test regardless of the addition of at least any one of an amine, a base agent, a surfactant, and a halogen compound.

In all of the Executed Examples 15 to 24 and the Comparative Examples 6 and 7, it did not take place to miss the ball after heating, and solder bumps were formed on the electrodes.

In the present embodiment, hexylene glycol was used as a solvent, but another solvent may be added, and the fluxes containing, for example, more than 0% by mass and less than 50% by mass of hexyl diglycol, 1,3-butanediol, octanediol, alkylene oxide-resorcin copolymer, 2-ethylhexyl diglycol, phenyl glycol, 2-ethyl-1,3-hexanediol, or terpineol also achieved good results in the solder wet and spread test, the test by the TG method, and the water washability test.

In the present embodiment, tartaric acid or glutaric acid was used as an organic acid, but another organic acid may be added, and the flux containing, for example, 1% by mass or more and 15% by mass or less of phenyl succinic acid, succinic acid, methyl methacrylate, malonic acid, adipic acid, azelaic acid, glycolic acid, diglycolic acid, thioglycolic acid, thiodiglycolic acid, propionic acid, malic acid, dimer acid, hydrogenated dimer acid, or trimer acid also achieved good results in the solder wet and spread test, the test by the TG method, and the water washability test.

In the present embodiment, polyoxyalkylene amine was used as an amine, but another amine such as imidazole or amino alcohol may be added, and specifically, the flux containing, for example, 0% by mass or more and 5% by mass or less of 2-methylimidazole, 2-undecylimidazole, 2-ethyl-4-methylimidazole, 1-benzyl-2-phenyl imidazole, polyoxyethylene amine, polyoxypropylene amine, 2-ethyl aminoethanol, diethanolamine, or triethanolamine also achieved good results in the solder wet and spread test, the test by the TG method, and the water washability test.

In the present embodiment, polyoxypropylene ethylenediamine or polyoxyethylene alkyl ether was used as a surfactant, but another surfactant may be added. The fluxes containing, as a surfactant, for example, 0% by mass or more and 15% by mass or less of hydroxypropylated ethylenediamine, ethylenediamine tetrapolyoxyethylene polyoxypropylene, polyoxyethylene alkyl amine, or polyoxyethylene alkyl amide also achieved good results in the solder wet and spread test, the test by the TG method, and the water washability test.

In the present embodiment, ethylamine hydrobromide or 2,3-dibromo-1,4-butanediol was used as a halogen compound, but another halogen compound may be added, and the flux containing 0% by mass or more and 5% by mass or less of an amine halogenated hydroacid salt or an organic halogen compound also achieved good results in the solder wet and spread test and the water washability test. The flux containing, as an amine halogenated hydroacid salt, for example, ethylamine hydrochloride, ethylamine hydriodide, 2-ethylhexyl amine hydrochloride, 2-ethylhexyl amine hydrobromide, 2-ethylhexyl amine hydriodide, cyclohexyl amine hydrochloride, cyclohexyl amine hydrobromide, or cyclohexyl amine hydriodide also achieved good results in the solder wet and spread test and the water washability test. The flux containing, as an organic halogen compound, trans-2,3-dibromo-2-butene-1,4-diol also achieved good results in the solder wet and spread test, the test by the TG method, and the water washability test.

In the present embodiment, the content proportions of the components are not limited to the above-described proportions. In addition, solder balls have been used in the present embodiment, but metal core balls such as Cu core balls may be used.

The present invention is applicable to a flux used for mounting solder balls or metal core balls on electrodes.

It should be understood by those skilled in the art that various modifications, combinations, sub-combinations and alterations may occur depending on design requirements and other factors insofar as they are within the scope of the appended claims or the equivalents thereof.

What is claimed is:

1. A flux which is rosin-free and consists of:
   50% by mass or more and 90% by mass or less of 2,4-diethyl-1,5-pentanediol,
   more than 0% by mass and less than 50% by mass of a solvent,
   1% by mass or more and 15% by mass or less of an organic acid component,
   0% by mass or more and 5% by mass or less of an amine,
   0% by mass or more and 5% by mass or less of a halogen compound,
   0% by mass or more and 5% by mass or less of a thixotropic agent,
   0% by mass or more and 5% by mass or less of a base agent, and
   0% by mass or more and 15% by mass or less of a surfactant,
   wherein the total amount of the 2,4-diethyl-1,5-pentanediol and the solvent is 83% by mass or more and 99% by mass or less, and
   wherein the organic acid component is selected from the group consisting of: glutaric acid, phenyl succinic acid, succinic acid, malonic acid, adipic acid, azelaic acid, diglycolic acid, thiodiglycolic acid, malic acid, tartaric acid, dimer acid, hydrogenated dimer acid, trimer acid, and combinations thereof.

2. The flux according to claim 1, wherein the weight of the flux after heating is 15% or less of the weight of the flux before heating, when packing 10 mg of the flux in an aluminum pan and heating the flux up to 250° C. at a temperature rising rate of 1° C./sec.

* * * * *